United States Patent [19]

Daberko et al.

[11] Patent Number: 5,742,737
[45] Date of Patent: Apr. 21, 1998

[54] METHOD FOR RECORDING VOICE MESSAGES ON FLASH MEMORY IN A HAND HELD RECORDER

[75] Inventors: Norbert P. Daberko, Oceanside; Richard K. Davis; Richard D. Bridgewater, both of San Diego, all of Calif.

[73] Assignee: Norris Communications Corporation, San Diego, Calif.

[21] Appl. No.: 810,210

[22] Filed: Mar. 3, 1997

Related U.S. Application Data

[63] Continuation of Ser. No. 339,976, Nov. 15, 1994, abandoned, which is a continuation-in-part of Ser. No. 229,570, Apr. 19, 1994, abandoned, which is a continuation-in-part of Ser. No. 229,731, Apr. 19, 1994, Pat. No. 5,491,774.

[51] Int. Cl.$^6$ ............................ G10L 9/00; G11B 27/031
[52] U.S. Cl. .......................................... 395/2.81; 365/27
[58] Field of Search ............................. 395/2.79, 2.81, 395/2.85, 2.86; 365/25, 29, 27, 30

[56] References Cited

U.S. PATENT DOCUMENTS

| | | | |
|---|---|---|---|
| 4,468,751 | 8/1984 | Plunkett, Jr. ................... | 364/900 |
| 4,687,200 | 8/1987 | Shirai ............................ | 273/148 |
| 5,056,145 | 10/1991 | Yamamoto et al. ............ | 381/51 |
| 5,357,595 | 10/1994 | Sudoh et al. .................. | 395/2.24 |
| 5,394,445 | 2/1995 | Ball et al. ...................... | 379/67 |
| 5,398,220 | 3/1995 | Barker ........................... | 369/25 |
| 5,442,641 | 8/1995 | Beranger et al. .............. | 371/21.2 |
| 5,491,774 | 2/1996 | Norris et al. .................. | 395/2.79 |
| 5,499,316 | 3/1996 | Sudoh et al. .................. | 395/2.79 |

FOREIGN PATENT DOCUMENTS 4207 447A1  9/1993  Germany .................... G10L 5/04

OTHER PUBLICATIONS

Microsoft Press Computer Dictionary, Microsoft Press, 2nd Edition, 1994 p. 168, Ed. Doyle.
Barre, "Flash Memory", IEEE Transactions on Magnetics, vol. 29, No. 6, Nov. 1993.
Masuoka, "Technology Trend of Flash—EEPROM", IEEE Symposium on VLSI Technology Digests of Technical Papers, Apr. 1992.

Primary Examiner—Allen R. MacDonald
Assistant Examiner—Susan Wieland
Attorney, Agent, or Firm—Thorpe, North & Western, LLP

[57] ABSTRACT

A solid state digital hand held recording device having a multifunctional switch assembly. A printed circuit board including a microcontroller electrically coupled to switch terminals operates to control the processing of sound into electrical signals and store said signals on a digital recording medium. The switch assembly actuates electrical signals coupled to said microcontroller thereby activating a sequence of actions (a program) stored within read-only memory device. A plurality of programs can be activated to instantaneously begin recording a message, verify the integrity of the recording medium, and index a message being recorded for rapid recall.

12 Claims, 5 Drawing Sheets

INDEXING OF MESSAGE

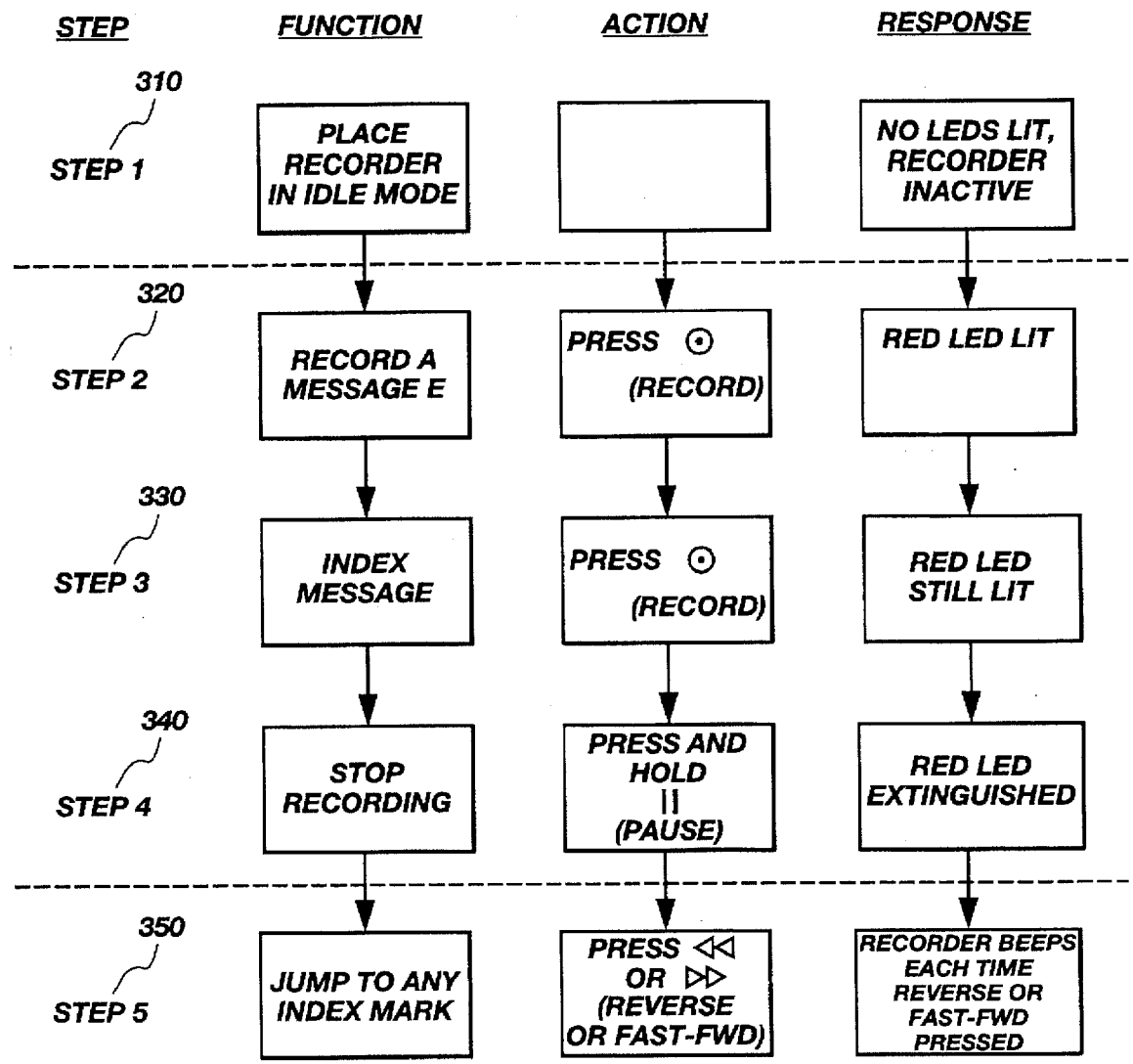
Fig. 4: INDEXING OF MESSAGE

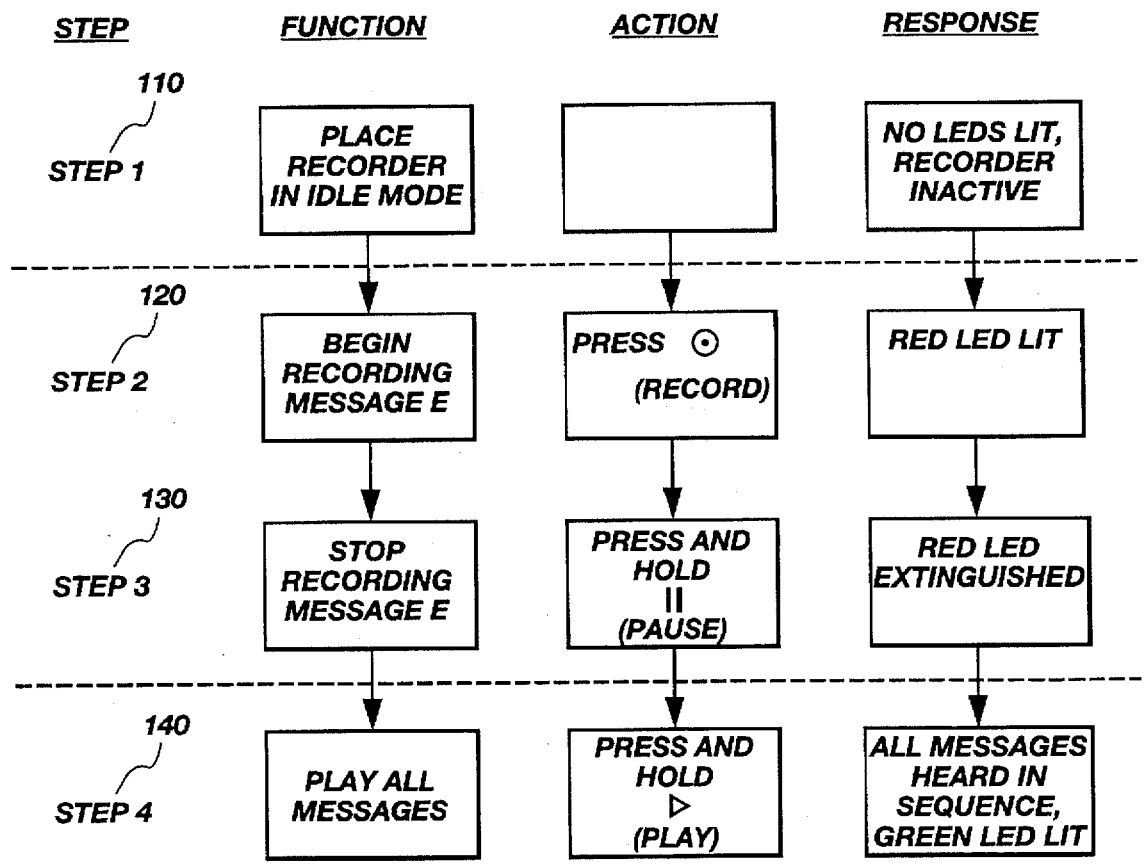
Fig. 2A: RECORDING

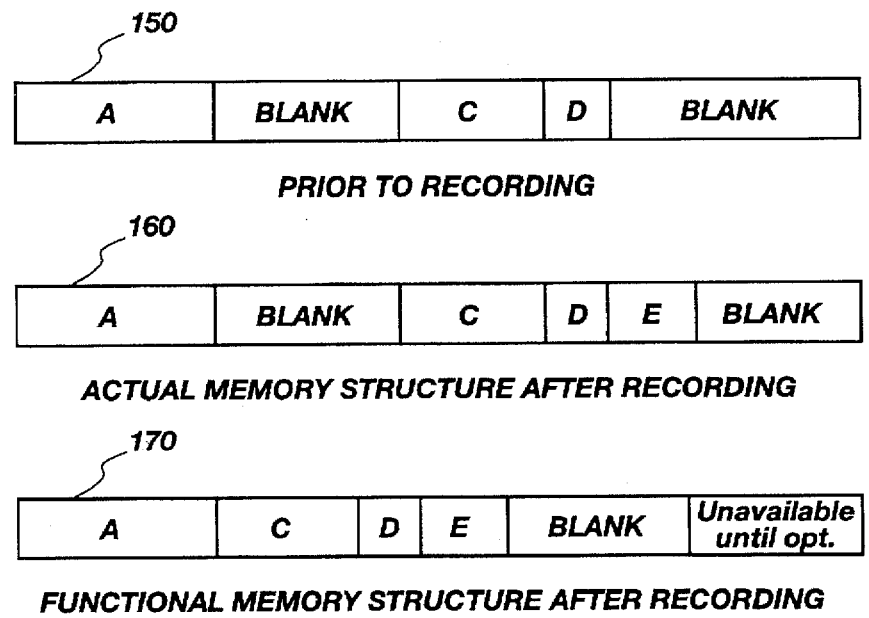
*Fig. 2B*
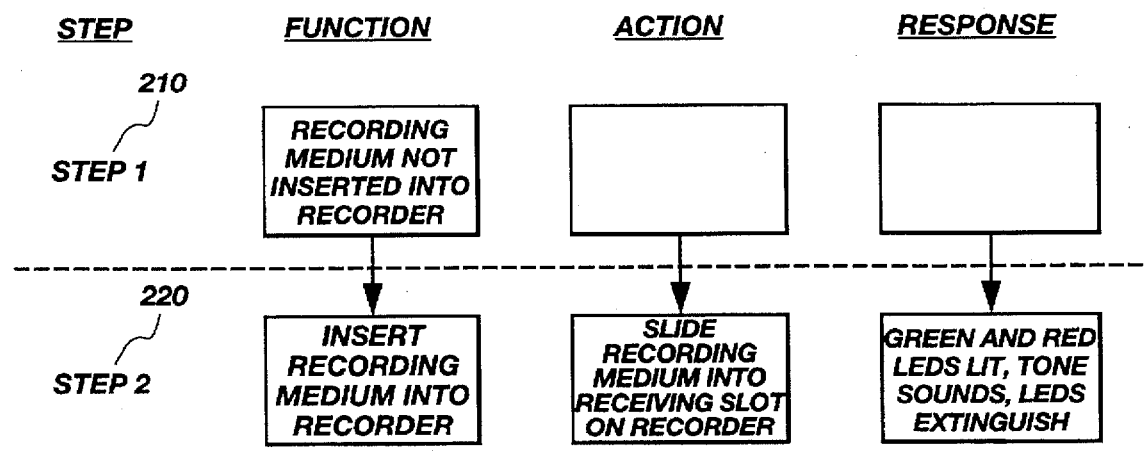
*Fig. 3A: MEMORY INTEGRITY VERIFICATION*

PRIOR TO MARKING DEFECTIVE MEDIA

ACTUAL MEMORY STRUCTURE AFTER MARKING

FUNCTIONAL MEMORY STRUCTURE AFTER MARKING

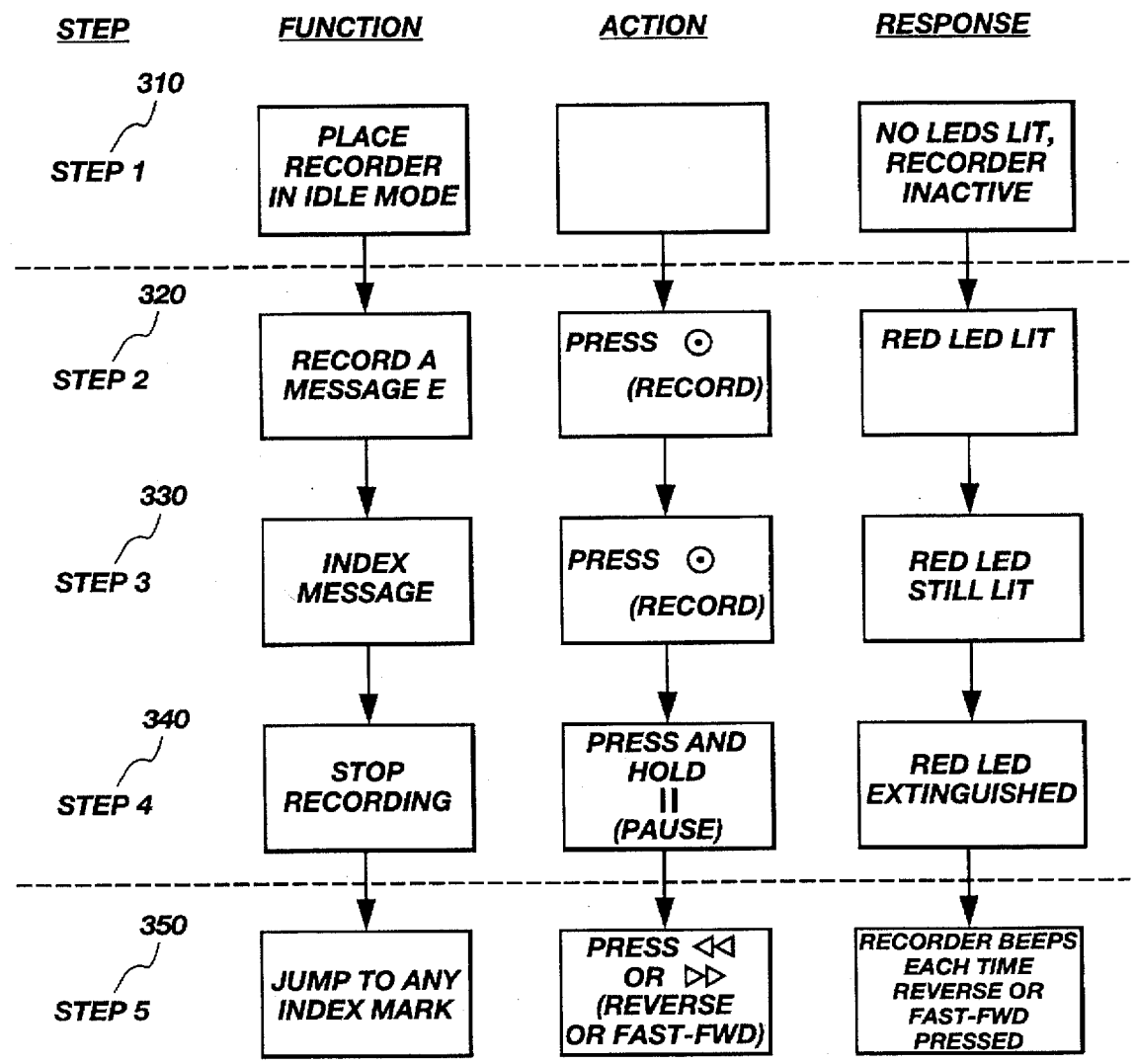
Fig. 4: INDEXING OF MESSAGE

METHOD FOR RECORDING VOICE MESSAGES ON FLASH MEMORY IN A HAND HELD RECORDER

This application is a continuation of application Ser. No. 08/339,976, filed Nov. 15, 1994, now abandoned, which was a CIP of Ser. No. 08/229,570, filed Apr. 19, 1994, now abandoned, which is a continuation-in-part of U.S. Pat. No. 5,491,774, filed on Apr. 19, 1994, and U.S. patent application Ser. No. 08/229,731.

BACKGROUND OF THE INVENTION

1. Field of the Invention

This invention pertains to recording devices, and in particular to hand held recording devices that are used to record voice messages, where a switch assembly on a solid state digital hand held recording device activates a recording mode whereby recording of voice messages is accomplished.

2. Prior Art

The method for dictating voice messages is largely determined by the devices available for dictation. The prior art is replete with recording devices that save information by selectively magnetizing a layer of magnetic-oxide material that is bonded to a thin flexible tape, commonly referred to as cassette tape.

Tape is a medium with deficiencies that until the present invention have been unavoidable, but we have become so accustomed to them that we often forget the drawbacks. We probably owe this willingness to overlook deficiencies to the fact that recording devices have become so indispensable to business. Nevertheless, these unavoidable deficiencies have turned the process of recording dictation into a typical sequence of the following steps:

1) The user inserts a cassette tape that contains previously recorded messages into a recording device;
2) The user begins playing the tape to ascertain whether the current tape position is a blank segment suitable for recording a new message;
3) The user finds that the current tape position has a message that the user does not want to record over, so the user must repeatedly fast forward and then listen to the tape to find a blank segment;
4) The user may find a blank tape segment and begins recording only to find after a new message is complete that another message has been partially recorded over;
5) The user may also find when listening to the message that a segment is garbled or there are moments of silence.

The recording medium of cassette tape forces the speaker to use the above process because the tape is analog and linear. In the prior art, a user cannot simply begin to record a message immediately upon picking up a recording device loaded with a cassette tape known to have recorded messages that cannot be discarded. The user is forced to begin a search of the tape to find a blank tape segment. If the device cannot play and fast-forward at the same time allowing the user to hear sound, the user might never find a blank segment if the user passes them unknowingly. However, even after finding a blank segment, the user might not listen to enough of the tape to hear all the messages, resulting in a lost or partially lost recording.

It would be an improvement over the prior art to be able to immediately begin recording a message without having to know where the other messages are recorded, while avoiding the danger of recording over messages that need to be saved.

Another deficiency of linear tape is that occasionally the recording media is defective, and no sound can be recorded over a particular tape segment. However, this defect or the length of the defect is rarely known to the user. It is only upon listening to a new message after making a recording that the defect is discovered which resulted in a recording gap. Often it is not possible to reconstruct the message if human memory fails, too much time elapses, or the defect is long.

Therefore, it would be another improvement over the prior art if before recording a message, the recording media could be tested to verify that it is nondefective. It would also be an improvement if after defective media was found, that the defective segment be skipped, and that any message recorded on memory before and after the defect did not reflect this physical gap in memory space.

Another drawback of tape is the inability to index segments of a message, where the indexed segments can be found instantaneously. The inventors are not aware of prior art that would permit a user to index the recording being made such that the user could instantaneously return to those message segments by jumping from index mark to index mark. Thus, it would an improvement if a user could index a recording as it is being made enabling a user to quickly return to the indexed message segments.

OBJECTS AND SUMMARY OF THE INVENTION

It is therefore an object of the present invention to provide a method and apparatus that is always able to record a new message without the delay typical of prior art recording media that must be searched to find a blank segment.

It is a further object of the invention to provide a method and apparatus for determining whether segments of recording media are defective and marking them as defective when found so that no messages by erroneously recorded to the defective segment and lost.

It is yet another object of the invention to provide a method and apparatus for indexing a message that facilitates rapid recall of indexed message segments.

These and other objects not specifically recited are realized in a solid state digital hand held recording device having a single function and multifunctional switch assembly. A printed circuit board including a microcontroller electrically coupled to said switch assemblies operates to control the processing of sound into electrical signals and store said signals on a digital recording medium. A single, manually operable switch activates a recording process. A single, manually operable rocker-pad is centrally mounted upon a pivot support of the hand held recording device and activates a multiple of functions. The record switch and rocker-pad actuate electrical signals coupled to said microcontroller thereby activating a sequence of actions (a program) stored within the microcontroller in a read-only memory (ROM) device. A plurality of programs can be activated by the manually operable record switch and rocker-pad to process digitally recorded sound as the user desires.

Also disclosed is a method for recording a new message without disturbing the physical continuity of existing messages and without manually searching for a blank segment of memory on the recording medium which includes the steps of (i) placing the recording device in an idle mode such that the recorder is inactive, and (ii) pressing the record switch to instantly begin recording a new message at the next available memory space following the last recorded message or insert.

This application also discloses a method for testing the integrity of all the memory space on the recording medium, which includes the steps of (i) starting the test of memory integrity by manually inserting a recording medium device into a plug assembly for electrically coupling to said recording device, or manually installing batteries in the recording device after coupling the recording medium to said recording device, and (ii) allowing the recording device to mark memory segments that will be skipped during recording if they are determined to be defective.

Also disclosed is a method for indexing a message as it is recorded. Recording and indexing a message includes the steps of (i) beginning a recording by pressing the record switch, (ii) indexing a message by pressing the record switch while recording, thereby recording a new message. This process has the effect of indexing because all messages can be instantaneously accessed, and can be played back in the sequence recorded.

These and other objects and advantages of the present invention will be set forth in the description which follows, and will be apparent to those skilled in the art based on the description taken in combination with the accompanying drawings. The objects and advantages of the invention may be realized and obtained by means of the instruments and combinations particularly pointed out in the appended claims.

DESCRIPTION OF THE DRAWINGS

FIG. 1A is a front view of a hand held digital recording device with a switch assembly and multifunctional switch assembly made in accordance with the principles of the present invention;

FIG. 1B is a perspective view of the multifunctional switch and the contact elements beneath it from FIG. 1A.

FIG. 1C is a perspective view of the record switch and the contact element beneath it from FIG. 1A.

FIG. 2A is a flowchart of steps for recording a message with the present invention, whereby instantaneous recording is enabled without the danger of recording over existing messages.

FIG. 2B is a diagram representing memory structure before and after a new recording is made in accordance with the steps of FIG. 2A.

FIG. 3A is a flowchart of steps for verifying the integrity of the recording medium used in the present invention.

FIG. 4 is a flowchart of steps for indexing a message to facilitate rapid search of a message's contents.

DETAILED DESCRIPTION OF THE INVENTION

Figure 3B:
FIG. 3B is a diagram representing memory structure before and after defective media is marked in accordance with the steps of FIG. 3A.
Figure 3B:
Figure 3B:
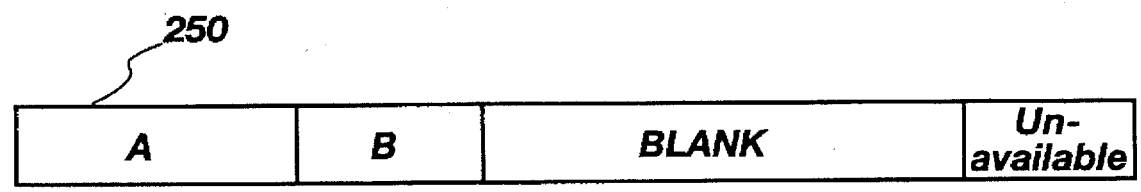
Figure 3B:
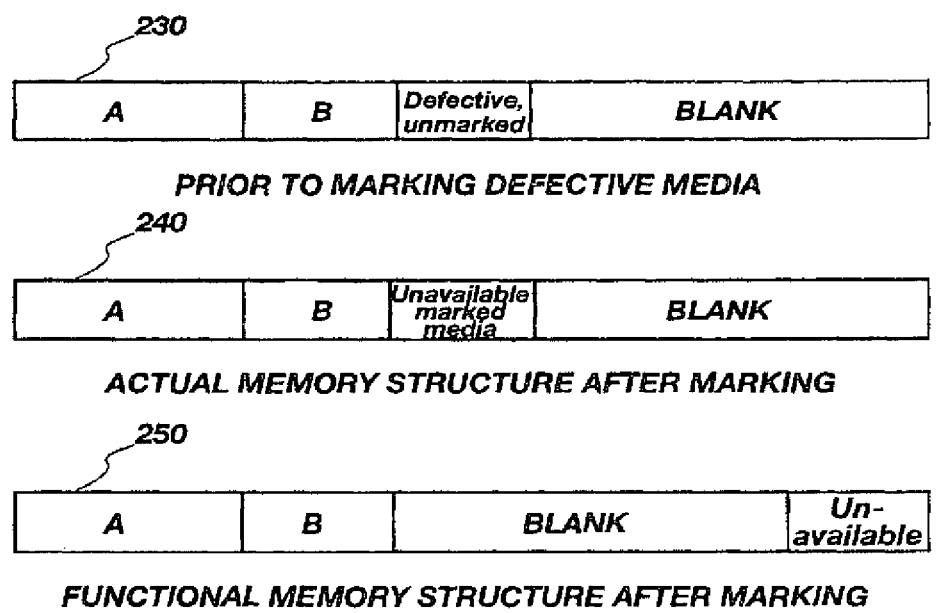

FIG. 1A illustrates the features of a hand held, solid state digital recording device 10. The hand held recorder includes a casement 12 containing a microphone element 14, a speaker element 15, a printed circuit board 13 (fragmented view, FIG. 1B), and a recording medium 18 (partially visible). The printed circuit board 13 beneath the face of the casement 12 includes a microcontroller 20 with an internal read only memory (ROM), said microcontroller being electrically coupled to the recording medium 18 and to switch assemblies 33 (multifunctional) and 36 (record) disposed on said circuit board 13 and appearing through openings in the casement 12. These components are well known within the industry.

The switch assemblies 33 and 36 differ from each other in structure. Switch element 33 is a rocker-pad pivotally mounted upon a pivot support (not shown). The pivot support allows the rocker-pad 33 to tilt about said pivot support, being responsive to manual manipulation of said rocker-pad 33. The rocker-pad 33 includes a periphery portion 30 with at least four lateral extremities 31a, 31b, 31c, 31d having electrical contacts 32a, 32b, 32c, 32d (FIG. 1B) beneath the rocker-pad 33 and parallel to the circuit board 13. Electrical switch terminals 22a, 22b, 22c, 22d (FIG. 1B) disposed under the rocker-pad 30 are aligned with said electrical contacts 32. When the rocker-pad 33 is manipulated, an electrical contact corresponding to the rocker-pad extremity 31 makes contact with a corresponding switch terminal 22. The functions executable by manipulating the rocker-pad 33 are many, despite there being only four specific labels 31a, 31b, 31c, 31d corresponding to the rocker-pad 33 extremities. The four labels are play 31a, fast-forward 31d, pause 31b, and reverse 31c.

An electrical signal is produced by making an electrical contact between one of the electrical contacts 32 and the corresponding switch terminal 22 disposed beneath. The signal goes to the microcontroller which determines which switch of the rocker-pad 33 was pressed, whether the record switch 36 was pressed, or a combination of the two. The microcontroller accesses the appropriate segment of internal ROM memory containing the instructions for executing the appropriate function. The switch assemblies 33 and 36 may also be operated in conjunction to produce an electrical signal defining a process that can not be activated by pressing a switch.

Switch assembly 36 is a manually operable record switch. Switch terminal 24 (FIG. 1C) is disposed under the record switch 36 and aligned to make contact between an electrical contact 25 disposed beneath the record switch and the switch terminal 24 when the record switch 36 is pressed. The electrical signal produced by depressing the record switch 36 also sends a signal to the microcontroller 20 which accesses the appropriate segment of ROM memory containing the instructions for executing whatever function is defined by pressing the record switch 36 alone or in conjunction with the multifunction switch 33.

FIG. 2A is a flowchart of the steps for recording a message. Specifically, the present invention enables the user to begin a new recording without the delay typical of prior art recording media. Whereas cassette tape must be wound to a blank segment of tape, the present invention uses digital flash memory that is particularly suited to provide instantaneous access to a blank segment of memory as disclosed in the parent application. Thus, one of the points of novelty is that the present invention can begin recording to a blank memory segment at the press of a switch. The perception of the user is that recording has begun instantaneously.

As shown by step 1, designated 110, a preliminary step is to put the recorder in idle mode. This means that the recorder is not playing or recording.

Step 2 designated 120 shows that the user presses the record switch 36. The user records a message, and a red LED 61 is lit. Because the flash memory provides rapid access to the next available memory segment, the user can begin speaking immediately.

Step 3 designated 130 shows that the user stops the recording by pressing and holding the pause switch 31b. The red LED 61 is extinguished. An alternative method for stopping the recording is to press the play switch 31a, lighting the green LED 60. Pressing play 31a will cause the just recorded message to play from the beginning, whereas pressing and holding pause only stops the recording.

Step 4 designated 140 is not part of the record process, but illustrates one of the points of novelty of the present invention. By pressing and holding the play switch 31a, all the messages on the recording medium are played back in sequence, without gaps of silence between them. The just recorded message will be the last message played.

FIG. 2B is a diagram of the flash memory digital structure used in the present invention. The box 130 represents a possible division of memory into messages and unused memory segments. Box 140 reflects the actual memory structure after recording the message E. As shown, the message begins immediately following the last recorded message, message D. The blank memory segment between messages A and C created by the deletion of a message B is unavailable for use until memory space is optimized. Box 150 shows that functionally, the messages are arranged as shown, appearing to be contiguous, and if played back, messages A, C, D and E would play as if no physical gaps appeared between them. As explained, not all memory is available for use until memory is optimized.

FIG. 3A is a flowchart of the steps for determining whether recording media is defective. By following the steps disclosed, defective memory segments cannot cause portions of a message to be lost.

Step 1 designated 210 is a preliminary step that requires the flash memory not be plugged into the recording device.

Step 2 designated 220 is the entire memory integrity verification process. The user slides the flash memory into its slot in the recorder. After a few moments, both the green 60 and red 61 LEDs light. A few moments later, a tone sounds and the LEDs 60 and 61 are extinguished. While the LEDs were both lit, the integrity of the memory segments of the flash memory unit were tested. If any of the memory is found to be defective, the segment is marked. The recorder will not attempt to record to or read from a memory so marked. Therefore, no portion of a memory segment can be lost by erroneously recording to memory that was defective before the message was recorded. An alternative method for causing the same verification of flash memory to be executed is accomplished by removing the batteries, and then reinstalling them. The recorder will run the same memory integrity verification.

FIG. 3B is a diagram of the flash digital memory structure used in the present invention. The box 230 represents a possible division of memory into messages, unused memory segments, and defective media that is not marked as defective. Box 240 reflects the actual memory structure after the memory integrity verification process has been executed, leaving the formerly defective but unmarked memory segment marked as defective. Functionally, the memory appears as shown in box 250. The defective marked media is simply ignored and does not interfere with recording or playing messages.

FIG. 4 is a flowchart of the steps to index a message as it is being recorded. Indexing a message facilitates recalling significant portions of a message that a user wants to rapidly recall.

Step 1 designated 310 shows the preliminary step to the indexing process of placing the recorder in the idle mode. This means the recorder is not playing or recording.

Step 2 designated 320 shows that the user presses the record switch 36, lighting the red LED 61.

Step 3 designated 330 shows that anytime the user wishes to index a message for rapid recall, the user simply presses the record switch 36 again. In effect, the user has begun a new message. However, it is important to remember that messages are recorded in sequence on the flash memory. Playing back messages will cause all messages to play until manually stopped. Because there are no time gaps between the playing of messages in the present invention, the message will appear as a single continuous message. However, the message has been indexed.

Step 4 designated 340 illustrates one of the points of novelty, that the user can jump to any index mark of the recorded message by simply pressing the fast-forward switch 31d to move forward among index marks, and pressing the reverse switch 31c to move backward.

It is to be understood that the described embodiments of the invention are illustrative only, and that modifications thereof may occur to those skilled in the art. Accordingly, this invention is not to be regarded as limited to the embodiments disclosed, but is to be limited only as defined by the appended claims herein.

What is claimed is:

1. A device for enabling immediate recording of a new message on a partially recorded flash memory digital recording medium without a delay caused by searching for blank memory available for recording on the flash memory digital recording medium, said device comprising:

a solid state digital hand held recording device having a multifunctional switch assembly and a separate record switch assembly, a flash memory digital recording medium including a region forming a continuity of pre-recorded messages, a printed circuit board including a microcontroller electrically coupled to the switch assemblies and operable to control the processing of sound into electrical signals, and store said electrical signals on the flash memory digital recording medium;

recording means coupled to the circuit board and activated by the record switch assembly and including means for (i) searching for an end of a last recorded message, (ii) identifying a point after the end of the last recorded message where the new message may begin, and (iii) beginning recording of the new message at the identified point;

sequencing playback means for playing the new message from the identified point defining the beginning of said new message with no manual involvement of the user other than activating the multifunctional switch means.

2. A device as defined in claim 1, wherein the multifunctional switch assembly includes a single, manually operable rocker-pad mounted upon the hand held recording device, said rocker-pad including means for activating playback of a pre-recorded message.

3. A device as defined in claim 1, wherein the microcontroller includes a read-only memory for storage of microcontroller instructions for executing the function of message recording.

4. A method for recording a new message on a hand held recording device without disturbing the physical continuity of existing messages and without manually searching for a blank segment of memory on the flash memory digital recording medium, said method comprising the steps of:

a) placing the recording device in an idle mode where all recorder functions are inactive; and b) activating a record switch causing the recording device to:

i) search for an end of a last recorded message on the recording medium, ii) identify a segment of flash memory past the end of a last recorded message as a beginning point where the new message may be recorded, and iii) begin recording a new message at the beginning point.

5. A method for verifying the integrity of memory on a removable flash memory recording medium chip for use within a hand held recording device, such that the flash memory is suitable for recording voice messages, said method comprising the steps of:

a) providing a removable flash memory recording chip and a hand held recording device with a plug assembly for electrically coupling the flash memory and the recording device; and b) activating a memory integrity test by manually inserting the flash memory chip into the plug assembly of said recording device to electrically couple the flash memory to the recording device.

6. A method as defined in claim 5, wherein the memory integrity test of step b) further comprises the steps of:

a) testing memory segments of the flash memory to determine whether said segments can record and play a voice message, or are defective; and b) marking defective memory segments so that the recording device will not record to said segments.

7. A method as defined in claim 5, further providing a method for verifying the integrity of memory on a removable flash memory recording medium chip, said method comprising the steps of:

a) providing a removable flash memory recording chip and a hand held recording device with a plug assembly for electrically coupling the flash memory and the recording device; and b) activating a memory integrity test of said flash memory by manually inserting batteries into the recording device that is electrically coupled to the flash memory.

8. The method for recording a new message on a hand held recording device as defined in claim 4 wherein the method comprises the additional steps of indexing a message as it is recorded in a hand held recording device, enabling a user to quickly return to an indexed segment of memory within the message, said method comprising the steps of:

a) beginning a recording by activating a record switch on the hand held recording device;

b) activating the record switch while recording to identify an index point of the recording to be indexed for future reference; and c) identifying each index point as a starting point of a new recording segment in a larger contiguous memory segment.

9. A device for enabling the testing of memory integrity in a removable flash memory recording medium and the marking of defective memory such that voice messages are only recorded to segments of flash memory capable of storing electrical signals, said device comprising:

a solid state digital hand held recording device having a multifunctional switch assembly and a record switch assembly, the flash memory digital recording medium including a region forming a continuity of pre-recorded messages, a printed circuit board including a microcontroller electrically coupled to the switch assemblies and operable to (1) control the processing of sound into electrical signals, (2) store said electrical signals on the recording medium, and (3) play said sounds stored in the flash memory digital recording medium; and memory integrity verification means for ascertaining whether the flash memory digital recording medium can record voice messages to said memory with no manual involvement of the user other than inserting the removable flash memory digital recording medium into a plug assembly in said recording device.

10. A device as defined in claim 8, wherein the microcontroller includes a read-only memory for storage of microcontroller instructions for executing the function of memory integrity verification.

11. A device for enabling indexing of a new message whereby a user may rapidly locate indexed segments of flash memory within the new message, said device comprising:

a solid state digital hand held recording device having a multifunctional switch assembly and a record switch assembly, a flash memory digital recording medium including a region forming a continuity of pre-recorded message, and a printed circuit board including a microcontroller electrically coupled to the switch assemblies and operable to control the processing of sound into electrical signals, store said electrical signals on the flash memory digital recording medium, and play said sounds stored on the flash memory digital recording medium;

message indexing means for indexing a message when the user activates the record switch while recording, thereby making an index point within the message stored on the flash memory digital recording medium; and indexing switching means for moving between the index points to enable the user to rapidly recall indexed messages.

12. A device as defined in claim 10, wherein the microcontroller includes a read-only memory for storage of microcontroller instructions for executing the function of indexing memory segments to facilitate rapid recall of indexed messages.

* * * * *

UNITED STATES PATENT AND TRADEMARK OFFICE
CERTIFICATE OF CORRECTION

| | | |
|---|---|---|
| PATENT NO. | : 5,742,737 | |
| APPLICATION NO. | : 08/810210 | |
| DATED | : April 21, 1998 | |
| INVENTOR(S) | : Daberko et al. | |

It is certified that error appears in the above-identified patent and that said Letters Patent is hereby corrected as shown below:

Column 6, line 44 in Claim 1, please delete the word "means" and insert --assembly--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 5,742,737 C1  
APPLICATION NO. : 90/011379  
DATED : April 21, 1998  
INVENTOR(S) : Daberko Page 1 of 1

It is certified that error appears in the above-identified patent and that said Letters Patent is hereby corrected as shown below:

On the Title page, in field (73), in "Assignee", in column 1, line 1, delete "Olympus Corporation, Shibuya-Ku, Tokyo (JP)" and insert -- e.Digital Corporation, San Diego, CA --, therefor Signed and Sealed this
First Day of January, 2013

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 5,742,737 | |
| APPLICATION NO. | : 08/810210 | |
| DATED | : April 21, 1998 | |
| INVENTOR(S) | : Norbert P. Daberko et al. | |

It is certified that error appears in the above-identified patent and that said Letters Patent is hereby corrected as shown below:

In the Drawings

Delete Drawing Sheets 1-5, and replace with Drawing Sheets 1-5. (attached)

In the Specifications

Column 5, Line 10, the reference numeral "130" should read --150--.

Column 5, Line 12, the reference numeral "140" should read --160--.

Column 5, Line 18, the reference numeral "150" should read --170--.

Signed and Sealed this
Seventh Day of May, 2013

Teresa Stanek Rea
*Acting Director of the United States Patent and Trademark Office*

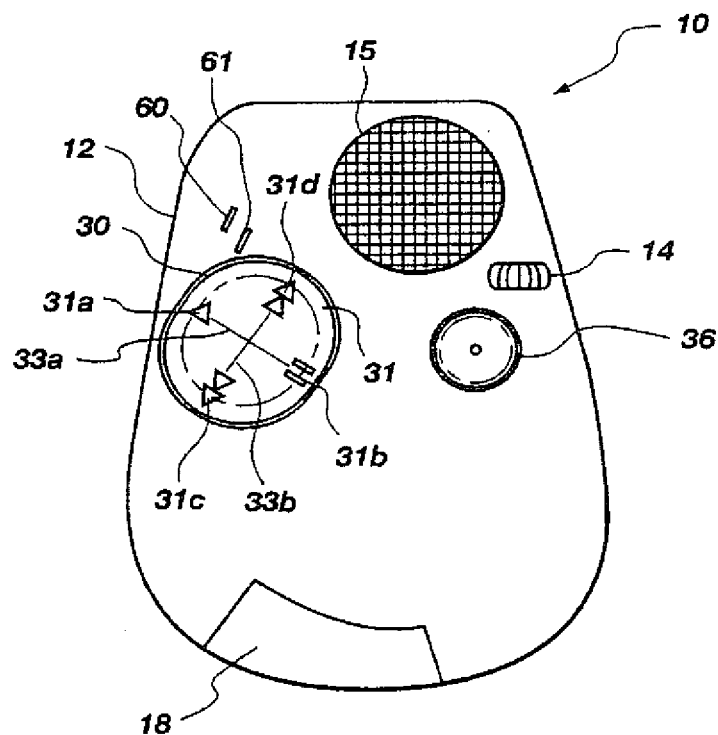
Fig. 1A
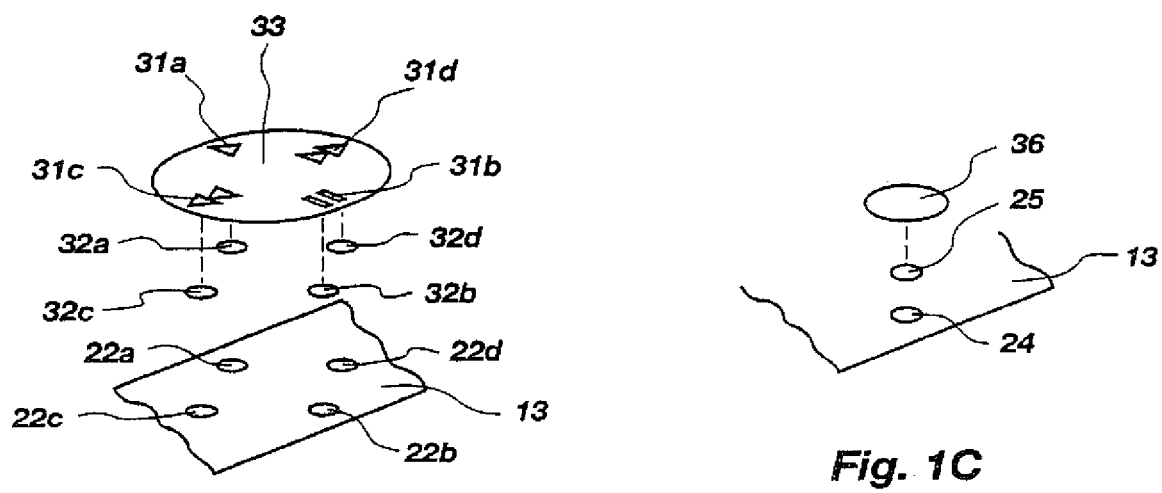
Fig. 1B
Fig. 1C

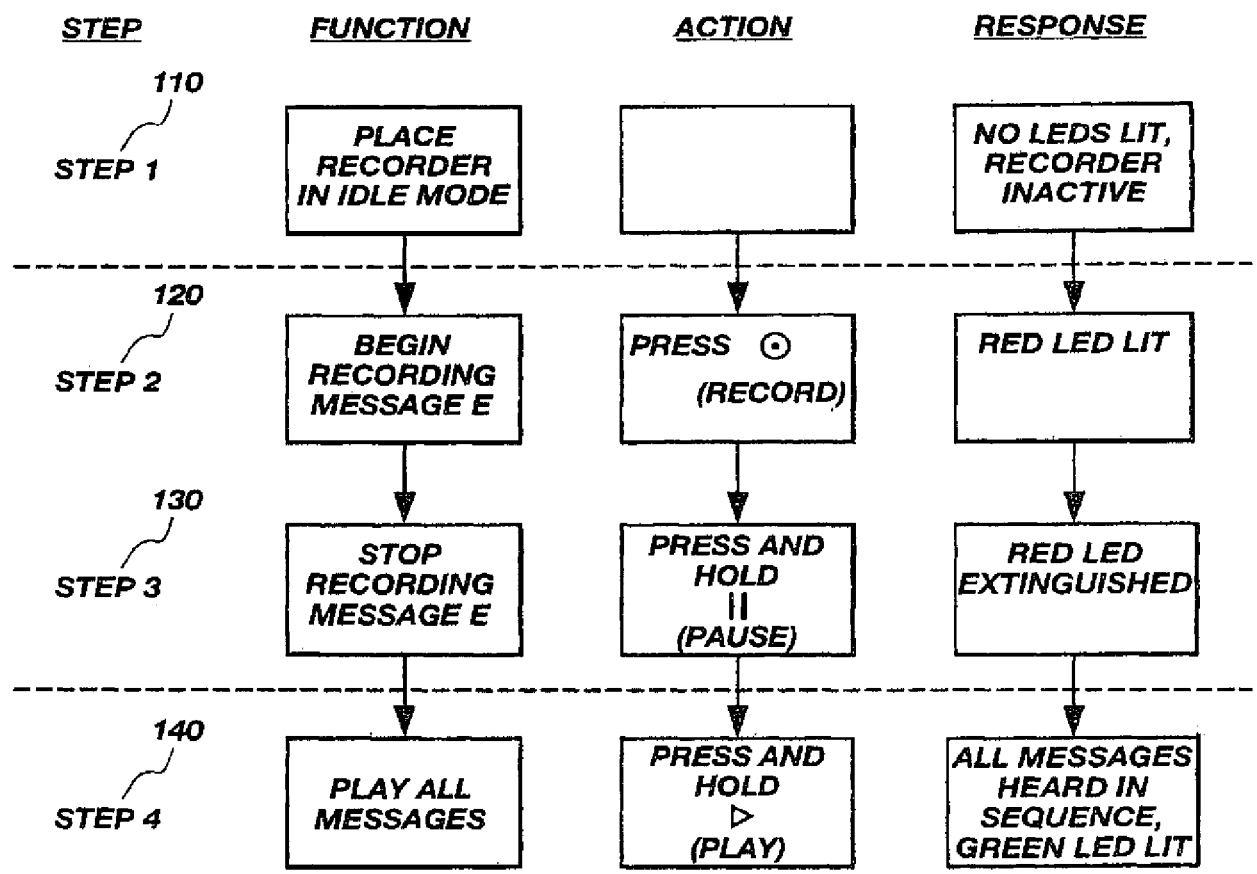
Fig. 2A: RECORDING

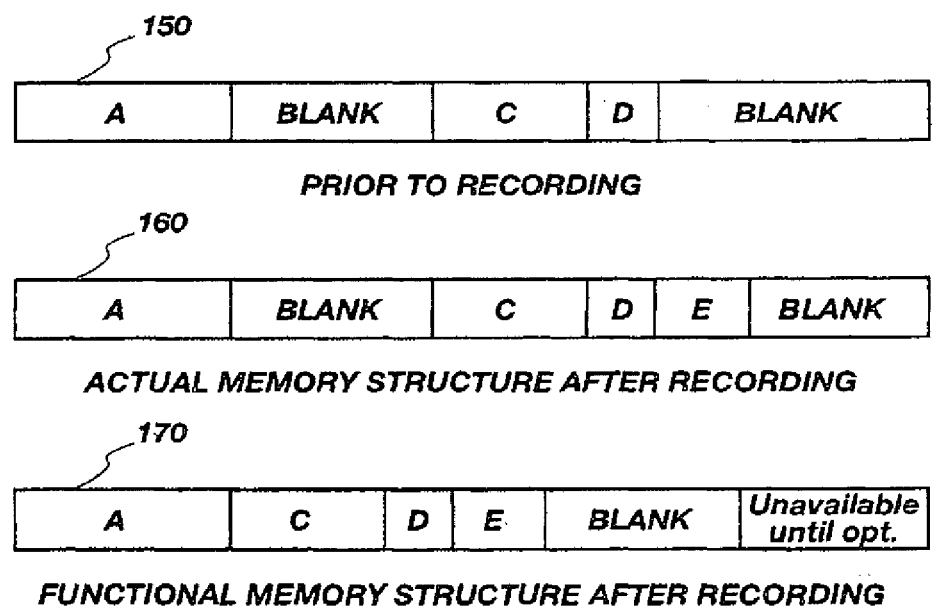
Fig. 2B
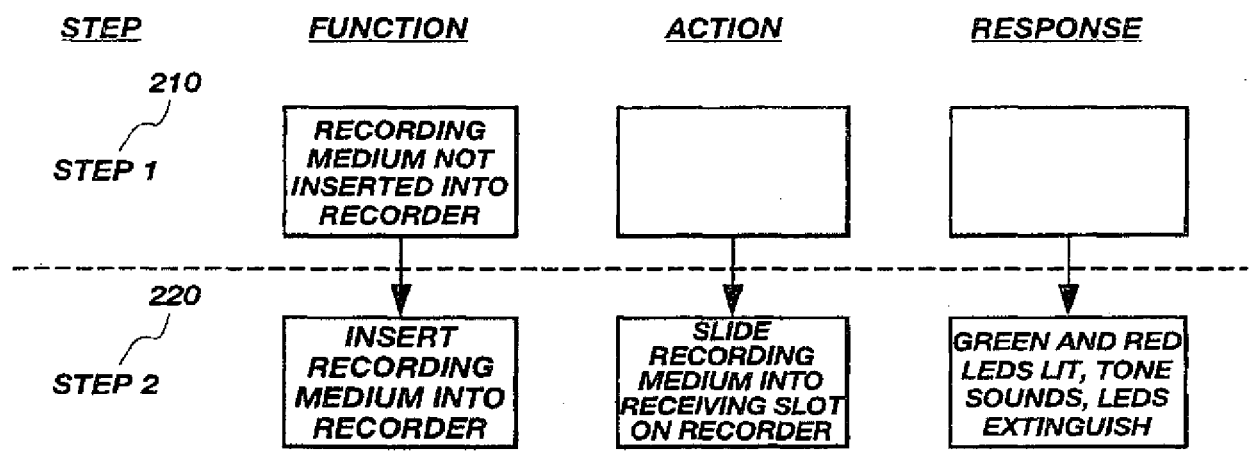
Fig. 3A: MEMORY INTEGRITY VERIFICATION

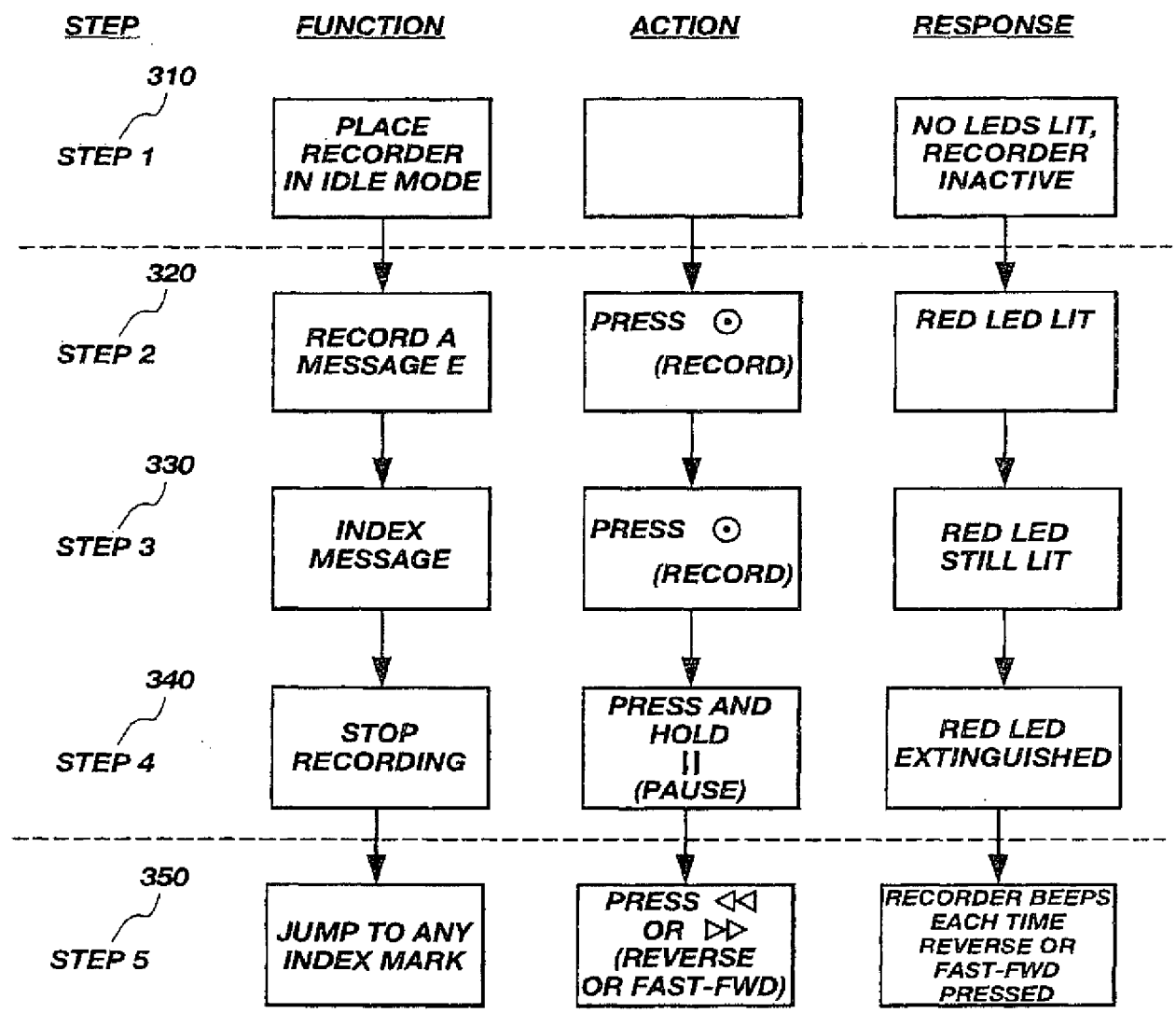
Fig. 4: INDEXING OF MESSAGE

US005742737C1

(12) EX PARTE REEXAMINATION CERTIFICATE (9370th)
United States Patent
Daberko et al.

(10) Number: US 5,742,737 C1
(45) Certificate Issued: Oct. 17, 2012

(54) METHOD FOR RECORDING VOICE MESSAGES ON FLASH MEMORY IN A HAND HELD RECORDER

(75) Inventors: Norbert P. Daberko, Oceanside, CA (US); Richard K. Davis, San Diego, CA (US); Richard D. Bridgewater, San Diego, CA (US)

(73) Assignee: Olympus Corporation, Shibuya-Ku, Tokyo (JP)

Reexamination Request:
No. 90/011,379, Dec. 8, 2010

Reexamination Certificate for:
Patent No.: 5,742,737
Issued: Apr. 21, 1998
Appl. No.: 08/810,210
Filed: Mar. 3, 1997

Certificate of Correction issued Nov. 24, 2009.

Related U.S. Application Data

(63) Continuation of application No. 08/339,976, filed on Nov. 15, 1994, now abandoned, which is a continuation-in-part of application No. 08/229,570, filed on Apr. 19, 1994, now abandoned, which is a continuation-in-part of application No. 08/229,731, filed on Apr. 19, 1994, now Pat. No. 5,491,774.

(51) Int. Cl.
*G10L 21/00* (2006.01)
*G11C 19/08* (2006.01)

(52) U.S. Cl. .................................. 704/272; 365/27
(58) Field of Classification Search .................. None
See application file for complete search history.

(56) References Cited

To view the complete listing of prior art documents cited during the proceeding for Reexamination Control Number 90/011,379, please refer to the USPTO's public Patent Application Information Retrieval (PAIR) system under the Display References tab.

*Primary Examiner* — Henry N Tran

(57) ABSTRACT

A solid state digital hand held recording device having a multifunctional switch assembly. A printed circuit board including a microcontroller electrically coupled to switch terminals operates to control the processing of sound into electrical signals and store said signals on a digital recording medium. The switch assembly actuates electrical signals coupled to said microcontroller thereby activating a sequence of actions (a program) stored within read-only memory device. A plurality of programs can be activated to instantaneously begin recording a message, verify the integrity of the recording medium, and index a message being recorded for rapid recall.

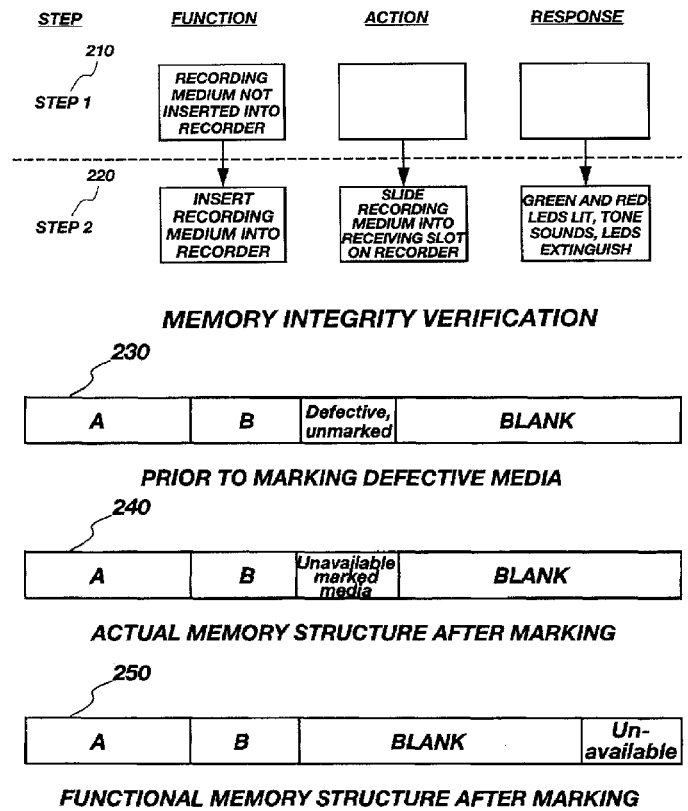

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 5 is cancelled.
New claim 13 is added and determined to be patentable.
Claims 1-4 and 6-12 were not reexamined.

*13. A method for verifying the integrity of memory on a removable flash memory recording medium chip for use within a hand held recording device, such that the flash memory is suitable for recording voice messages, said method comprising the steps of:*

*a) providing a removable flash memory recording chip and a hand held recording device with a plug assembly for electrically coupling the flash memory and the recording device; and*

*b) activating a memory media integrity test by manually inserting the flash memory chip into the plug assembly of said recording device to electrically couple the flash memory to the recording device.*

\* \* \* \* \*